(12) United States Patent
Alvi et al.

(10) Patent No.: US 11,689,093 B2
(45) Date of Patent: Jun. 27, 2023

(54) CURRENT SOURCE INVERTER HAVING HYBRID SWITCHES

(71) Applicant: GM Global Technology Operations LLC, Detroit, MI (US)

(72) Inventors: Muhammad H. Alvi, Troy, MI (US); Alireza Fatemi, Canton, MI (US); Suresh Gopalakrishnan, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 284 days.

(21) Appl. No.: 17/193,515

(22) Filed: Mar. 5, 2021

(65) Prior Publication Data

US 2022/0286064 A1 Sep. 8, 2022

(51) Int. Cl.
| | |
|---|---|
| *H02M 1/00* | (2006.01) |
| *H02M 7/53846* | (2007.01) |
| *H01L 27/07* | (2006.01) |
| *H02M 7/5387* | (2007.01) |
| *H02M 1/38* | (2007.01) |
| *H02M 7/5388* | (2007.01) |
| *B60L 50/60* | (2019.01) |
| *H02P 27/08* | (2006.01) |

(52) U.S. Cl.
CPC ...... *H02M 1/0087* (2021.05); *H01L 27/0727* (2013.01); *H02M 1/38* (2013.01); *H02M 7/5387* (2013.01); *H02M 7/538466* (2013.01); *B60L 50/60* (2019.02); *H02M 7/5388* (2013.01); *H02P 27/08* (2013.01)

(58) Field of Classification Search
CPC ............ H02M 1/0087; H02M 1/38; H02M 7/538466; H02P 27/08
See application file for complete search history.

(56) References Cited

U.S. PATENT DOCUMENTS

| | | | | |
|---|---|---|---|---|
| 5,986,907 | A * | 11/1999 | Limpaecher | .............. H02J 3/01 363/61 |
| 10,044,258 | B2 * | 8/2018 | Bryant | ................... H02M 5/04 |
| 2020/0295673 | A1 * | 9/2020 | Dai | .................. H02M 7/53871 |

* cited by examiner

*Primary Examiner* — Adolf D Berhane
*Assistant Examiner* — Afework S Demisse
(74) *Attorney, Agent, or Firm* — Vivacqua Crane PLLC

(57) ABSTRACT

A current source inverter includes a first phase leg including a plurality of switching devices, a second phase leg including a plurality of switching devices, and a third phase leg including a plurality of switching devices. The current source inverter also includes a zero-state phase leg including at least one switching device, wherein the zero-state phase leg is configured to transition from an open state to prevent current flow to a closed state to allow current flow between a positive and negative terminal during a dead-band time.

20 Claims, 4 Drawing Sheets

CURRENT SOURCE INVERTER HAVING HYBRID SWITCHES

INTRODUCTION

The present disclosure relates to current source inverters, and more particularly to a current source inverter and rectifier having a hybrid switch implementation.

Hybrid electric or battery electric vehicle transmissions typically includes one or more high-voltage machine electric machines, such as an electric traction motor. Electric machines deliver/charge power to or draw power from a rechargeable direct current (DC) battery pack. The energized electric machines adjust torques of the various gear sets of the transmission to achieve optimal system efficiency. Converters are typically used for converting voltages to suitable levels for use by the electric machines and/or accessory loads in the vehicle.

Semiconductor switches of an inverter, such as a current source inverter or a voltage source inverter, are controlled via pulse-width modulation or other switching control signals to convert the battery output voltage to an alternating current (AC) output voltage. The AC output voltage from the inverter is ultimately transmitted to the individual phase windings of the electric machine, and the energized electric machine powers the drivetrain of the vehicle.

SUMMARY

According to several aspects, a current source inverter includes a first phase leg including a plurality of switching devices, a second phase leg including a plurality of switching devices, and a third phase leg including a plurality of switching devices. The current source inverter also includes a zero-state phase leg including at least one switching device, wherein the zero-state phase leg is configured to transition from an open state to prevent current flow to a closed state to allow current flow between a positive and negative terminal during a dead-band time.

In other features, the plurality of switching devices of the first phase leg comprises a bidirectional switching device and a unidirectional switching device, wherein a node connection to a load is disposed between the bidirectional switching device and the unidirectional switching device.

In other features, the bidirectional switching device comprises a first switch and a second switch connected in series.

In other features, the first switch and the second switch comprise a voltage-controlled switch.

In other features, the voltage-controlled switch comprises at least one of a silicon insulated gate bipolar transistor (IGBT), a silicon carbide metal-oxide semiconductor field effect transistor (MOSFET), a silicon superjunction MOSFET, a Gallium nitride (GaN) field-effect transistor (FET), a SiC junction-gate field-effect transistor (JFET), a wideband-gap (WBG) device, or an ultra-wideband-gap device (UWBG).

In other features, the unidirectional switching device comprises a switch in series with a diode.

In other features, the plurality of switching devices of the first leg comprises at least a first unidirectional switch and a second unidirectional switch connected in series, the plurality of switching devices of the second leg comprises at least a first unidirectional switch and a second unidirectional switch connected in series, and the plurality of switching devices of the third leg comprises at least a first bidirectional switch and a second directional switch connected in series.

In other features, the at least one switching device of the zero-state phase leg comprises a unidirectional switching device.

In other features, the at least one switching device of the zero-state phase leg comprises a bidirectional switching device.

According to several aspects, a current source inverter includes a first phase leg including a plurality of switching devices, a second phase leg including a plurality of switching devices, and a third phase leg including a plurality of switching devices. The current source inverter also includes a zero-state phase leg including at least one bidirectional switching device, wherein the zero-state phase leg is configured to transition from an open state to prevent current flow to a closed state to allow current flow between a positive and negative terminal during a dead-band time.

In other features, the plurality of switching devices of the first phase leg comprises a bidirectional switching device and a unidirectional switching device, wherein a node connection to a load is disposed between the bidirectional switching device and the unidirectional switching device.

In other features, the bidirectional switching device comprises a first switch and a second switch connected in series.

In other features, the first switch and the second switch comprise a voltage-controlled switch.

According to several aspects, a current source inverter includes a first phase leg including a plurality of switching devices, a second phase leg including a plurality of switching devices, and a third phase leg including a plurality of switching devices. The current source inverter also includes a zero-state phase leg including at least one unidirectional switching device, wherein the zero-state phase leg is configured to transition from an open state to prevent current flow to a closed state to allow current flow between a positive and negative terminal during a dead-band time.

In other features, the plurality of switching devices of the first phase leg comprises a bidirectional switching device and a unidirectional switching device, wherein a node connection to a load is disposed between the bidirectional switching device and the unidirectional switching device.

In other features, the bidirectional switching device comprises a first switch and a second switch connected in series.

In other features, the first switch and the second switch comprise a voltage-controlled switch.

In other features, the voltage-controlled switch comprises at least one of a silicon insulated gate bipolar transistor (IGBT), a silicon carbide metal-oxide semiconductor field effect transistor (MOSFET), a silicon superjunction MOSFET, a Gallium nitride (GaN) field-effect transistor (FET), a SiC junction-gate field-effect transistor (JFET), a wideband-gap (WBG) device, or an ultra-wideband-gap device (UWBG).

In other features, the unidirectional switching device comprises a switch in series with a diode.

In other features, the plurality of switching devices of the first leg comprises at least a first unidirectional switch and a second unidirectional switch connected in series, the plurality of switching devices of the second leg comprises at least a first unidirectional switch and a second unidirectional switch connected in series, and the plurality of switching devices of the third leg comprises at least a first bidirectional switch and a second directional switch connected in series.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
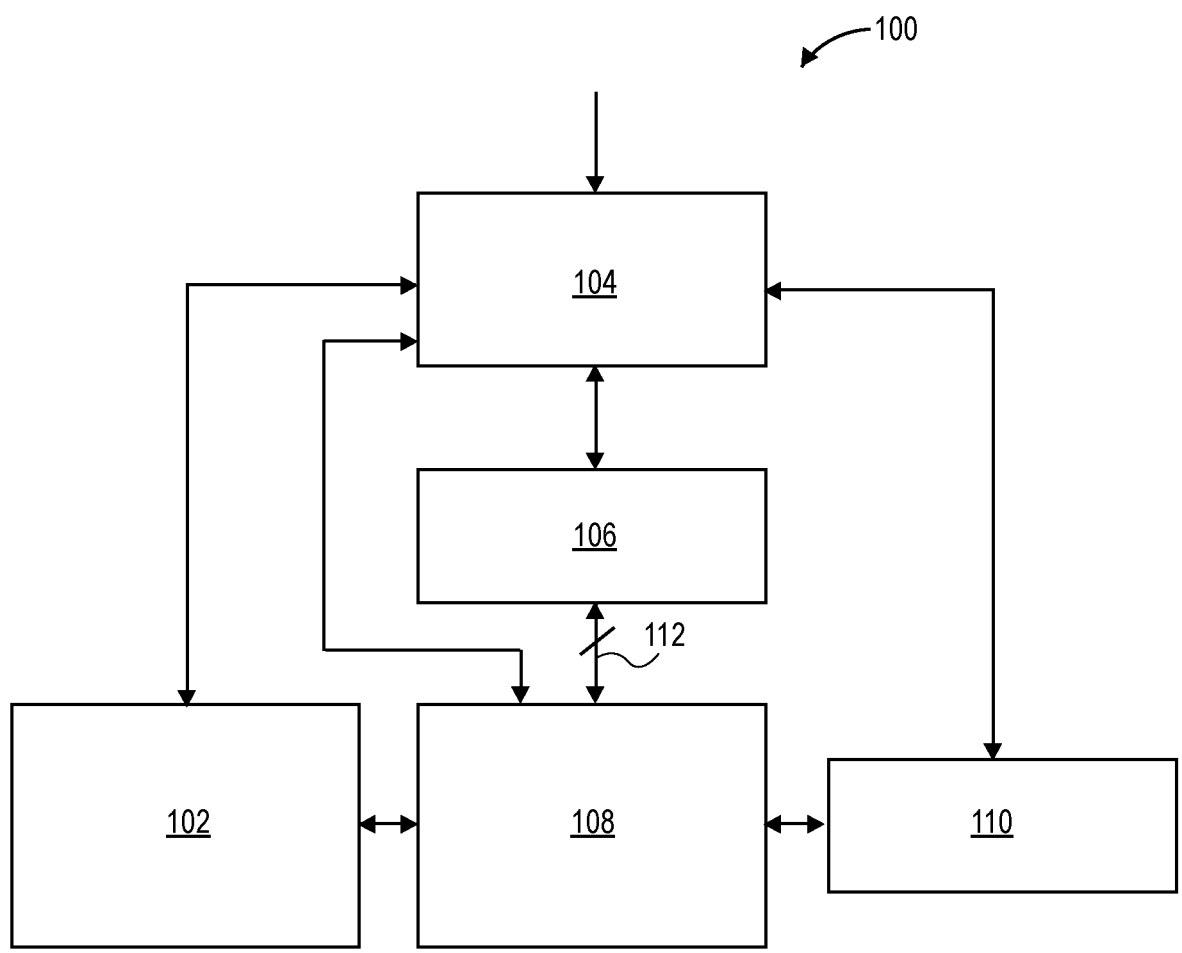
FIG. 1 is a block diagram of an electrical system according to an example implementation.

FIG. 1 illustrates an example electrical system 100 according to an example implementation. The electrical system 100 can comprise vehicle components, such as powertrain and/or traction drive components of a vehicle, whose ordinary functions may include powering a traction motor to generate and deliver motor torque to a drive wheels for propulsion of the vehicle or for performing other useful work aboard the vehicle. As shown, the electrical system 100 can include a battery 102, a controller 104, a gate driver 106, a current source inverter 108, and a motor 110.

In an example implementation, the battery 102 can comprise an onboard rechargeable energy storage system (RESS) that include may include one or more high-voltage, independently rechargeable battery packs adapted for storing high-voltage electrical energy used for propelling an electric-drive vehicle. The RESS may be a deep-cycle, high-ampere capacity battery system rated for approximately four hundred (400) to approximately eight hundred (800) volts direct current (VDC) or more, for example, depending on a desired vehicle range, gross vehicle weight, and power ratings of the various loads drawing electrical power from the RESS.

The controller 104 can include at least one processor and sufficient memory for storing computer-readable instructions. The memory includes tangible, non-transitory memory, e.g., read only memory, whether optical, magnetic, flash, or otherwise. The controller 104 also includes sufficient amounts of random-access memory, electrically erasable programmable read only memory, and the like, as well as a high-speed clock, analog-to-digital and digital-to-analog circuitry, and input/output circuitry and devices, as well as appropriate signal conditioning and buffer circuitry. The controller 104 can receive charging request signals from one or more electronic control units (ECUs) of the vehicle. For example, an ECU associated with the vehicle may provide a torque increase request signal. Based on the torque increase request signal, the controller 104 can transmit a control signal to the gate driver 106 to control one or more switches within the current source inverter 108 to supply an AC output voltage or output current to the load 110. The current source inverter 108 can govern transmission of electrical energy to and from the load 110. As shown, the gate driver 106 can be connected to the current source inverter 108 via a bus 112. The bus 112 provides a connection between the gate driver 106 and each of the switches and/or legs of the current source inverter 108. In various implementations, the controller 104 can include a pulse-width-modulator that provides pulse-width-modulated signals to the gate driver 106. The gate driver 106 can operate the current source inverter 108 based on the signals received from the pulse-width-modulator.

Figure 2:
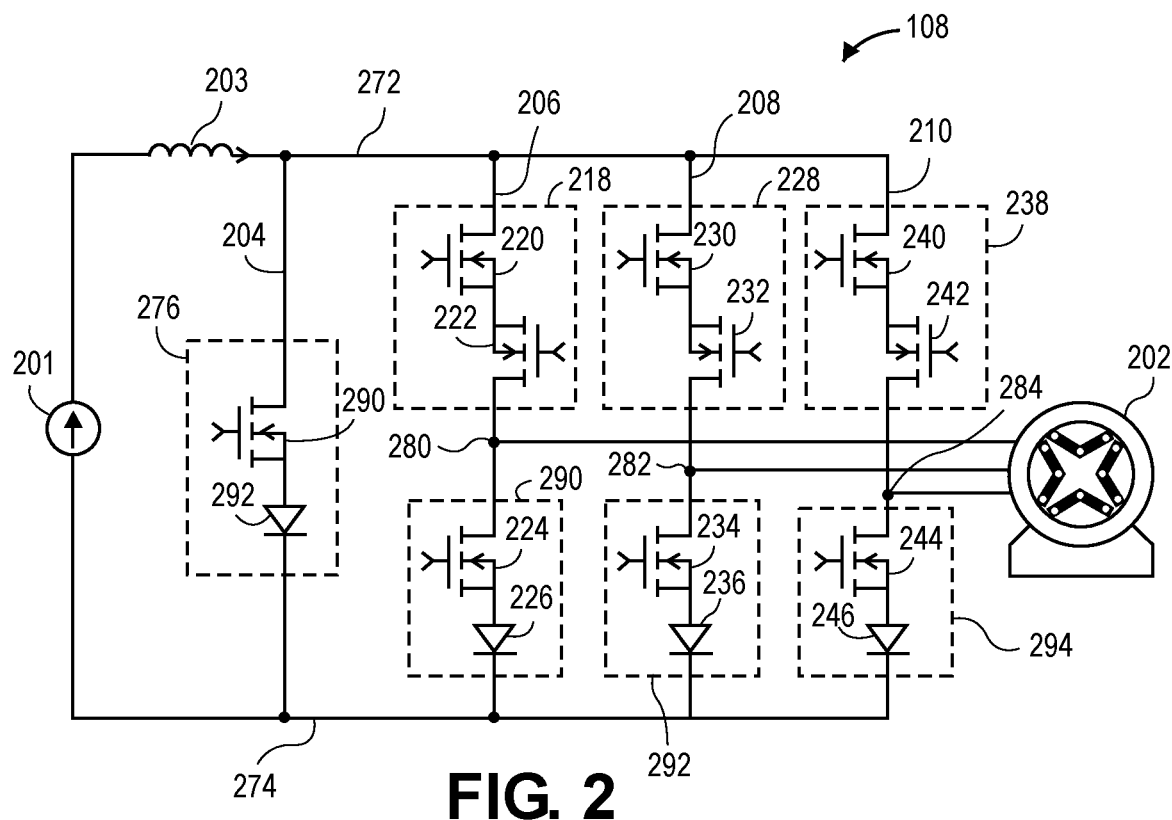
FIGS. 2 through 4 are circuit diagrams of a current source inverter according to various implementations.

The load 110, in an example implementation, comprises a traction motor 202 (see FIG. 2). The traction motor 202 can include multiple machine windings that can provide at least three-phase current to create a rotating magnetic field to rotate a rotor of the traction motor 202 to propel the vehicle.

Figure 3:
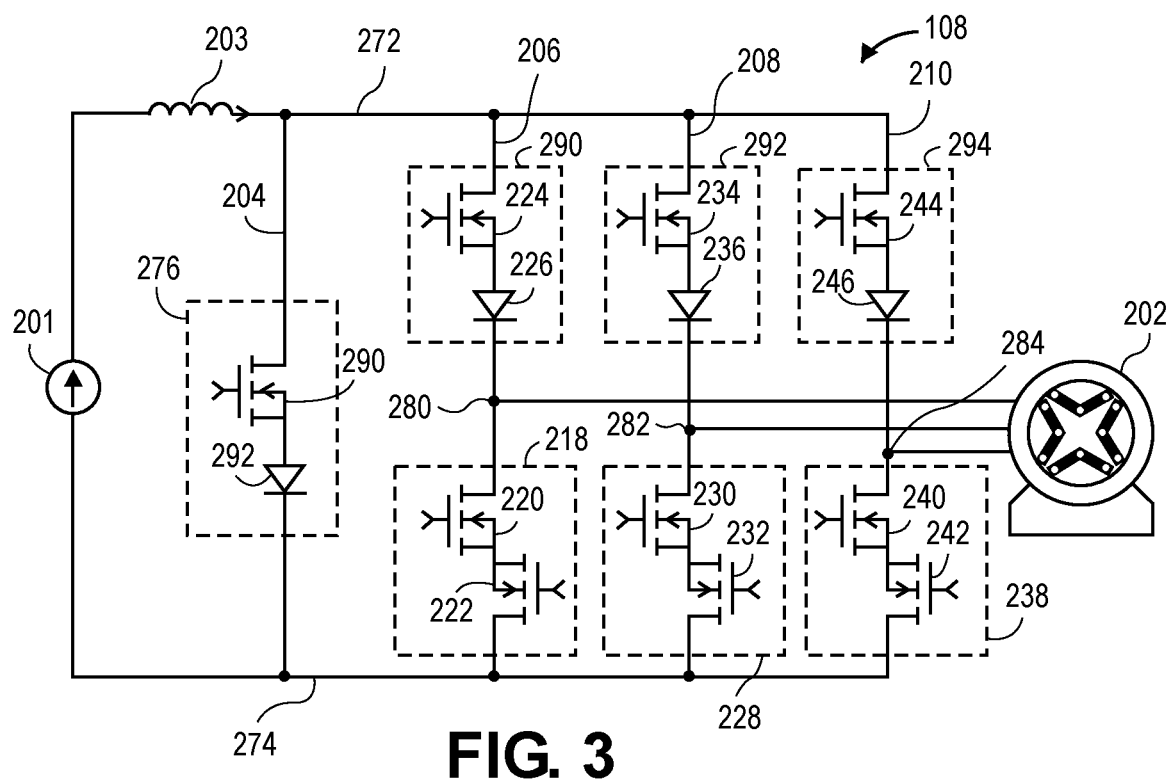
Figure 4:
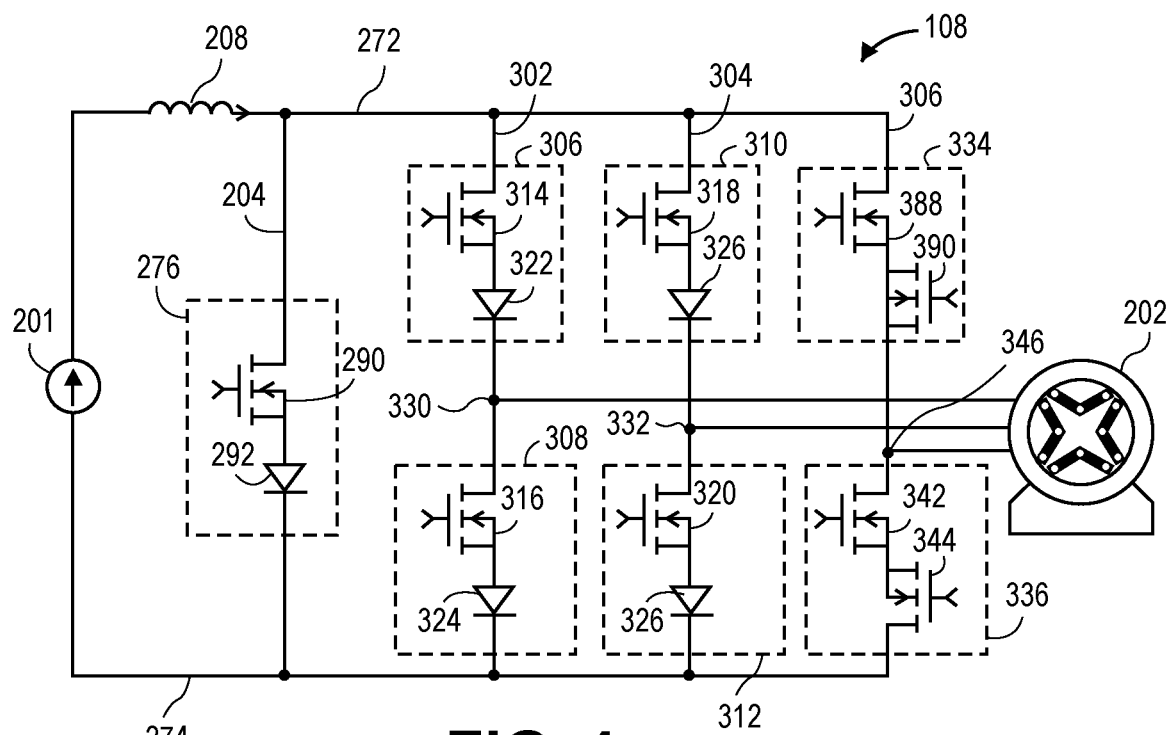

FIGS. 2 through 4 illustrate example implementations of the current source inverter 108. As discussed in greater detail below, the current source inverter 108 illustrated in FIGS. 2 and 3 comprise phase legs that comprise dissimilar switches, e.g., one switch of the phase leg comprises a fully bidirectional switch device and the other switch comprises a reverse voltage blocking unidirectional switch device. As discussed below, the unidirectional switch device can comprise at least two voltage-controlled switches connected in series. FIG. 4 illustrates an example implementation in which the current source inverter 108 includes two legs that are each comprised of at least two unidirectional switch devices and a single leg comprised of at least two bidirectional switch devices.

Each of the implementations can further include another leg, e.g., a zero-state leg, that comprises at least one voltage-controlled switches. The zero-state leg can be controlled to mitigate open circuits within the current source inverter 108, as discussed herein. In an example implementation, the zero-state leg can be comprised of a voltage-controlled switch in series with a diode, e.g., a unidirectional switch device. In another example implementation, the zero-state leg can be comprised of a bidirectional switch device that comprises two voltage-controlled switches connected in series. In these implementations, gate terminals of the voltage-controlled switches of the bidirectional switch device are connected to the same output of the gate driver 106.

The voltage-controlled switches can comprise, but are not limited to, a silicon insulated gate bipolar transistor (IGBT), a silicon carbide (SiC) metal-oxide semiconductor field effect transistor (MOSFET), a silicon (Si) superjunction MOSFET, a Gallium nitride (GaN) field-effect transistor (FET), a SiC junction-gate field-effect transistor (JFET), other wideband-gap (WBG) or ultra-wideband-gap semiconductor power switching device (UWBG), or other suitable switch having a corresponding gate to which a gate signal is applied to change the on/off state of a given switch. It is understood that in some implementations, the switches may comprise current controlled switches.

As used herein, diode may refer to a diode of various types such as a p-n junction type, a Schottky barrier type, etc. with various ratings. As understood by a person of skill in the art, a diode is a two-terminal electrical component that conducts current primarily in one direction from an anode to a cathode.

Referring to FIGS. 2 and 3, the current source inverter 108 includes a zero-state leg 204 and multiple phase legs 206, 208, 210 that include one or more switching devices as described in greater detail below. The phase legs 206, 208, 210 each connect to a corresponding machine phase terminal of the traction motor 202, e.g., one of the machine windings of the traction motor 202.

As shown, the phase legs 206, 208, 210 each include a respective fully bidirectional switch devices and/or reverse voltage blocking unidirectional switch devices. The phase leg 206 includes a first bidirectional switch device 218 that comprises a first switch 220 and a second switch 222, e.g., voltage-controlled switches. The phase leg 206 also includes a unidirectional switch device 290 including a third switch 224 and a first diode 226. The phase leg 208 includes a second bidirectional switch device 228 that comprises a fourth switch 230 and a fifth switch 232. The phase leg 208 also includes a unidirectional switch device 292 that includes a sixth switch 234 and a second diode 236. The phase leg 210 includes a third bidirectional switch device 238 that comprises a seventh switch 240 and an eighth switch 242. The phase leg 210 also includes a unidirectional switch device 294 that includes a ninth switch 244 and a third diode 246.

The bus 112 can connect to various gate terminals of the switches 220, 222, 224, 230, 232, 234, 240, 242, 244. In an example implementation, the gate terminals of the switches that comprise the bidirectional switch devices 218, 228, 238 are connected to a corresponding output of the gate driver 106, e.g., the bus 112. For example, gate terminals of the switches 220, 222 are connected to a first output, gate terminals for switches 230, 232 are connected to a second output, and gate terminals for switches 240, 242 are connected to a third output. Thus, the gate terminals for the bidirectional switch devices 218, 228, 238 each receive a corresponding gate control signal. The gate terminals for the switches 222, 232, 242 are connected to separate gate driver 106 outputs.

Based on control signals from the controller 104, the gate driver 106 provides gate control signals to the gate terminal of the switches 220, 222, 224, 230, 232, 234, 240, 242, 244 to cause the switches 220, 222, 224, 230, 232, 234, 240, 242, 244 to transition between an open state and a closed state to control current flow within the current source inverter 108.

As shown in FIGS. 2 and 3, nodes 280, 282, 284 that connect to the respective phase legs 206, 208, 210 to the traction motor 202 are disposed between the bidirectional switch devices 218, 228, 238 of the phase legs 206, 208, 210 and the switches 224, 234, 244 connected in series with the diodes 226, 236, 246 of the corresponding phase legs 206, 208, 210. In these implementations, the switches 224, 234, 244 connected in series with the diodes 226, 236, 246, e.g., unidirectional switch devices 290, 292, 294, allow for current flow in one direction. As shown in FIGS. 2 and 3, the positions of the bidirectional switch devices 218, 228, 238 and the unidirectional switch devices 290, 292, 294 may be swapped, e.g., interchangeable, in some implementations. While FIGS. 2 and 3 illustrate only three (3) phases, it is understood that various implementations of the present disclosure can be extended to N number of phases, where N is an integer.

FIG. 4 illustrates an example implementation of the current source inverter 106 that includes phase legs 302, 304, 306. As shown, the phase legs 302, 304 include unidirectional switch devices 306, 308, 310, 312. The unidirectional switch devices 306, 308, 310, 312 each comprise a respective switch 314, 316, 318, 320 connected in series with a diode 322, 324, 326, 328. As shown, nodes 330, 332 are positioned between the unidirectional switch devices of the phase legs 302, 304. The phase leg 306 includes a first bidirectional switch device 334 and a second bidirectional switch device 336. The bidirectional switch device 334 comprises switches 338, 340 connected in series, and the bidirectional switch device 336 comprises switches 342, 344 connected in series. A node 346 that connects the phase leg 306 to the traction motor 202 is positioned between bidirectional switch devices 334, 336.

Figure 5:
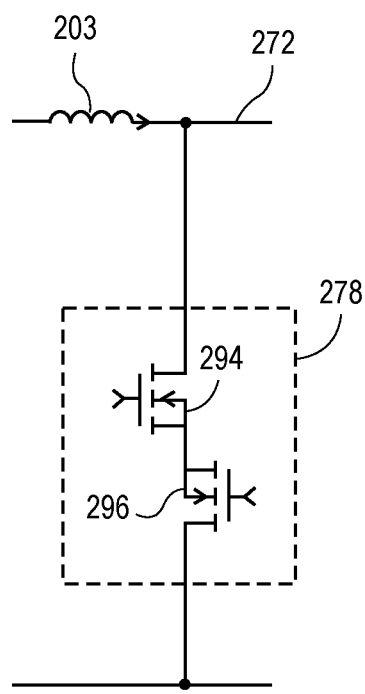
FIG. 5 is a circuit diagram of a zero-state leg of the current source inverter according to an example implementation.

The zero-state phase leg 204 can provide a connection between positive and negative terminals 272, 274 to mitigate open circuits within the current source inverter 108. In the implementations illustrated in FIGS. 2 through 4, the zero-state phase leg 204 can comprise a unidirectional switch device 276. The unidirectional switch device 276 comprises a switch 290 connected in series with a diode 292. FIG. 5 illustrates an example implementation of the zero-state phase leg 204 that comprises a bidirectional switch device 278. The bidirectional switch device 278 can include switches 294, 296 connected in series.

The current source inverter 108 can receive current from a current source 201, e.g., current provided by the battery 102 and the inductor 203. The inductor 203 is connected between the current source 201 and the positive terminal 272. The inductor 203 may be an inductor of various types with various inductance values. As understood by a person of skill in the art, an inductor is a passive two-terminal electrical component that stores energy in a magnetic field when electric current flows through it. An inductance value for inductor 203 may be selected to carry a load current based on an application area of the current source inverter 108 as understood by a person of skill in the art.

In the implementations shown, the total number of gate signals provided by the gate driver 106 may be seven (7) as the gate terminals for each unidirectional switch device and each bidirectional switch device are connected to the output of the gate driver 106. As such, the current source inverter 108 described herein may require relative lower gate signal complexity and lower costs compared with current source inverters comprised of all bidirectional switch devices. The efficiency of the current source inverter 108 may also be relatively higher with respect to current source inverters comprised of all unidirectional switch devices.

Figure 6:
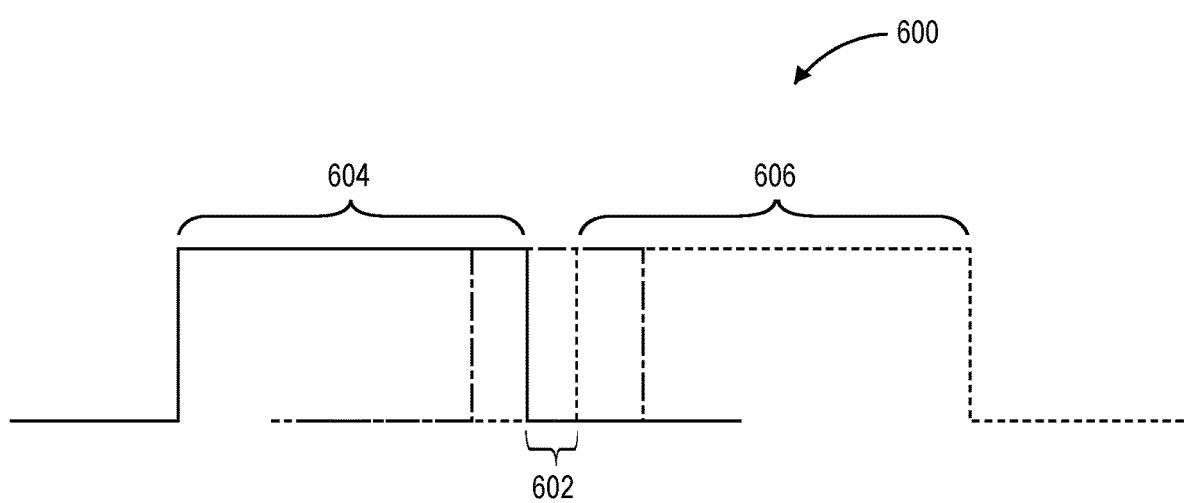
FIG. 6 is a graph illustrating example gate control signals that include a dead-band time between two switching states.

FIG. 6 is an example graph 600 illustrating gate control signals generated by the gate driver 106. A dead-band time (DB) 602 is included between a first switching state 604 and a second switching state 606. The switching states 604, 606 refer to time periods for controlling various switches of the phase legs of the current source inverter 108 to supply current from the current source 201 to the load 110. As illustrated, portions of the switching states 604, 606 may at least partially overlap with the dead-band time 602. During the dead-band time 602, the zero-state phase leg 204 is transitioned from an open state to a closed state to mitigate possible open circuits within the phase legs of the current source inverter 108.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:
1. A current source inverter comprising:
a first phase leg including a plurality of switching devices;
a second phase leg including a plurality of switching devices;
a third phase leg including a plurality of switching devices; and
a zero-state phase leg including at least one switching device, wherein the zero-state phase leg is configured to transition from an open state to prevent current flow to a closed state to allow current flow between a positive and negative terminal during a dead-band time,
wherein the plurality of switching devices of the first phase leg comprises a bidirectional switching device and a unidirectional switching device, and wherein a node connection to a load is disposed between the bidirectional switching device and the unidirectional switching device.

2. The current source inverter of claim 1, wherein the bidirectional switching device comprises a first switch and a second switch connected in series.

3. The current source inverter of claim 2, wherein the first switch and the second switch comprise a voltage-controlled switch.

4. The current source inverter of claim 3, wherein the voltage-controlled switch comprises at least one of a silicon insulated gate bipolar transistor (IGBT), a silicon carbide metal-oxide semiconductor field effect transistor (MOSFET), a silicon superjunction MOSFET, a Gallium nitride (GaN) field-effect transistor (FET), a SiC junction-gate field-effect transistor (JFET), a wideband-gap (WBG) device, or an ultra-wideband-gap device (UWBG).

5. The current source inverter of claim 2, wherein the first switch and the second switch are current-controlled switches.

6. The claim of claim 1, wherein the unidirectional switching device comprises a switch in series with a diode.

7. The claim of claim 1, wherein the plurality of switching devices of the second leg comprises at least a first unidirectional switch and a second unidirectional switch connected in series, and the plurality of switching devices of the third leg comprises at least a first bidirectional switch and a second directional switch connected in series.

8. The current source inverter of claim 1, wherein the at least one switching device of the zero-state phase leg comprises a unidirectional switching device.

9. The current source inverter of claim 1, wherein the at least one switching device of the zero-state phase leg comprises a bidirectional switching device.

10. A current source inverter comprising:
a first phase leg including a plurality of switching devices;
a second phase leg including a plurality of switching devices;
a third phase leg including a plurality of switching devices; and
a zero-state phase leg including at least one bidirectional switching device, wherein the zero-state phase leg is configured to transition from an open state to prevent current flow to a closed state to allow current flow between a positive and negative terminal during a dead-band time,
wherein the plurality of switching devices of the first phase leg comprises a bidirectional switching device and a unidirectional switching device, and wherein a node connection to a load is disposed between the bidirectional switching device and the unidirectional switching device.

11. The current source inverter of claim 10, wherein the bidirectional switching device comprises a first switch and a second switch connected in series.

12. The current source inverter of claim 11, wherein the first switch and the second switch comprise a voltage-controlled switch.

13. The current source inverter of claim 12, wherein the voltage-controlled switch comprises at least one of a silicon insulated gate bipolar transistor (IGBT), a silicon carbide metal-oxide semiconductor field effect transistor (MOSFET), a silicon superjunction MOSFET, a Gallium nitride (GaN) field-effect transistor (FET), a SiC junction-gate field-effect transistor (JFET), a wideband-gap (WBG) device, or an ultra-wideband-gap device (UWBG).

14. The current source inverter of claim 11, wherein the first switch and the second switch are current-controlled switches.

15. The claim of claim 10, wherein the unidirectional switching device comprises a switch in series with a diode.

16. The claim of claim 10, wherein the plurality of switching devices of the second leg comprises at least a first unidirectional switch and a second unidirectional switch connected in series, and the plurality of switching devices of the third leg comprises at least a first bidirectional switch and a second directional switch connected in series.

17. A current source inverter comprising:
a first phase leg including a plurality of switching devices;
a second phase leg including a plurality of switching devices;
a third phase leg including a plurality of switching devices; and
a zero-state phase leg including at least one unidirectional switching device, wherein the zero-state phase leg is configured to transition from an open state to prevent current flow to a closed state to allow current flow between a positive and negative terminal during a dead-band time,
wherein the plurality of switching devices of the first phase leg comprises a bidirectional switching device and a unidirectional switching device, and wherein a node connection to a load is disposed between the bidirectional switching device and the unidirectional switching device.

18. The current source inverter of claim 17, wherein the bidirectional switching device comprises a first switch and a second switch connected in series.

19. The current source inverter of claim 18, wherein the first switch and the second switch comprise a voltage-controlled switch.

20. The current source inverter of claim 18, wherein the first switch and the second switch are current-controlled switches.

* * * * *